(12) United States Patent
Ho

(10) Patent No.: US 7,102,327 B2
(45) Date of Patent: Sep. 5, 2006

(54) MOTOR CURRENT RECONSTRUCTION VIA DC BUS CURRENT MEASUREMENT

(75) Inventor: Eddy Ying Yin Ho, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/125,875

(22) Filed: May 10, 2005

(65) Prior Publication Data

US 2005/0206341 A1    Sep. 22, 2005

Related U.S. Application Data

(63) Continuation-in-part of application No. 10/402,107, filed on Mar. 27, 2003.

(60) Provisional application No. 60/368,860, filed on Mar. 28, 2002.

(51) Int. Cl.
*H02P 3/18* (2006.01)
*H02P 23/00* (2006.01)
*H02P 25/00* (2006.01)
*H02P 27/00* (2006.01)

(52) U.S. Cl. ............... 318/812; 318/811; 318/599; 318/801; 318/808; 363/41; 363/98

(58) Field of Classification Search ............ None
See application file for complete search history.

(56) References Cited

U.S. PATENT DOCUMENTS

| 4,847,743 | A | * | 7/1989 | Kamiyama | 363/41 |
|---|---|---|---|---|---|
| 5,182,701 | A | * | 1/1993 | Mochikawa et al. | 363/98 |
| 5,280,419 | A | * | 1/1994 | Amler | 363/37 |
| 5,285,145 | A | * | 2/1994 | Minowa et al. | 318/808 |
| 5,614,803 | A | * | 3/1997 | Morioka et al. | 318/801 |
| 5,852,551 | A | * | 12/1998 | Lee | 363/39 |
| 5,942,876 | A | * | 8/1999 | Maekawa | 318/801 |
| 6,005,783 | A | * | 12/1999 | Xue et al. | 363/36 |
| 6,653,812 | B1 | * | 11/2003 | Huo et al. | 318/801 |
| 6,751,105 | B1 | * | 6/2004 | Yamanaka et al. | 363/41 |
| 6,924,618 | B1 | * | 8/2005 | Matsushiro et al. | 318/811 |

* cited by examiner

*Primary Examiner*—Marlon T. Fletcher
*Assistant Examiner*—Renata McCloud
(74) *Attorney, Agent, or Firm*—Ostrolenk, Faber, Gerb & Soffen, LLP

(57) ABSTRACT

A technique for reconstructing phase currents based on measurements of a DC bus current. Non-observable regions of DC bus current samples to reconstruct phase currents are reduced in size by using two phase space vector modulation. The non-observable regions can be further reduced by omitting deadtime insertions for switch actuations when output current is higher than a given threshold. Voltage command vectors in non-observable areas can be constructed by two time averaged vectors one of which is constructed to obtain an observable DC bus current reflecting motor phase current. The additive vectors have the same combined time average value as that of the voltage command vector in order to preserve volt-seconds. Current samples may also be averaged to provide a more accurate reconstruction of phase current. Current samples are time delayed to avoid transients for more accurate readings. When three phase PWM inverter modulation results in inability to determine the motor phase current from the DC bus measurement, the technique includes dynamically switching to two phase PWM modulation to reduce the time interval when the motor phase current is not determinable through the DC bus current measurement.

13 Claims, 9 Drawing Sheets

(a) 3-phase modulation  (b) 2-phase modulation (a) 3-phase commutation (b) 2-phase commutation

MOTOR CURRENT RECONSTRUCTION VIA DC BUS CURRENT MEASUREMENT

RELATED APPLICATION

This application is a continuation-in-part of U.S. patent application Ser. No. 10/402,107, filed on Mar. 27, 2003, entitled Motor Current Reconstruction Via DC Bus Current Measurement, which is based on and claims benefit of U.S. Provisional Application No. 60/368,860, filed on Mar. 28, 2002, entitled Motor Current Reconstruction Via DC Bus Current Measurement, to each of which a claim of priority is hereby made.

BACKGROUND

1. Field of the Invention

The present invention relates generally to motor current feedback measurements, and relates more specifically to a computational reconstruction of motor current obtained through measurement of a DC bus current feeding the motor driver inverter.

2. Description of Related Art

Inverters for three phase motor drives are well known in the industry. Typically, a DC bus supplies switched power to different phases of an AC motor through an inverter. A design approach used to supply switching commands and sequences to the inverter involves the use of space vector modulation using pulse width modulation (PWM) arrangement. For example, a switch vector plane is illustrated in FIGS. 1A and 2A with specific switch states for controlling the switches of the inverter as noted at the vertices of the hexagon. As known to those of skill in the art, the switch state generally refers to the states of the high side switches in the three inverter half bridges. For example, state $V_2$ (110) means that the high side switches connected to phases U, V and W are controlled so that the high side switches connected to phases U and V are on and the high side switch connected to phase W is off. Correspondingly, the low side switches for phases U, V and W would be, at the same time, respectively, off, off and on.

With this type of motor control, it is desirable to accurately measure motor phase current to provide a high performance control. However, it is often difficult to accurately measure motor phase current over wide current and temperature ranges. For example, current sensing resistors may be used in the motor phase lines. However they do not provide the accuracy and precision needed in a high performance motor drive, especially at high currents, and also waste power. Current sensing transformers may also be used, but these are also subject to non-linearities and can be large and expensive to implement.

In a pulse width modulated (PWM) inverter drive system, motor phase current can be determined from measurement of the DC bus current when non-zero basic vectors are used. Each basic vector is assigned a specific time in a PWM cycle to generate the command voltage vector. However, if a basic vector is used only for a very short period of time, motor phase current cannot be directly determined from the DC bus current. This lack of observability of motor phase current is due to practical considerations in the implementation of the PWM inverter drive system. For example, time delays caused by A/D converter sample and hold times, slewing of voltage during switch turn on, and other delay factors and other parasitic effects that distort the DC link current from an ideal step waveform to an overshoot with ringing type waveform prevent the effects of basic vectors used for a very short time from being observed on the DC bus.

In the space vector plane shown in FIG. 1A, the non-observable regions are illustrated as being located along the borders of the sections of the space vector plane, i.e., around the basic vectors in the shaded regions. Without being able to observe motor phase currents during these control periods, it is difficult to achieve a robust and high performance motor drive. FIG. 1B illustrates the case where one phase can be accurately sampled during vector (100) duration), but neither of the other phase currents can be directly sampled because the duration of the active vector is too short in the interval T2/2, i.e., the reference voltage vector (110) is in the non-observable area of FIG. 1A.

With respect to observability of motor phase current through measurement of the DC bus current, various attempts have been made to overcome the drawbacks described above. In one approach, the switching frequency of the inverter is varied to avoid the problem with unobservability. However, this approach includes a change in the controller gains, and a coordination with the switching frequency, adding to the complexity of the control. Also, when the voltage vector is in the non-observable region, double references in an opposite phase are used to compensate for the non-observable current, increasing the number of switching events.

Another difficulty in observing motor currents by measuring DC bus current is illustrated in FIG. 2A, where a low modulation index is used. During low modulation index cycles, the PWM signals for the three phases have nearly equal durations. As a result, the particular active voltage vector is not used long enough to ensure proper sampling of the DC link (or bus) current. This problem is illustrated in FIG. 2B, where switching intervals occur so closely together that reconstruction of the motor current by measurement of the DC bus current is problematic at best. In addition, a minimum time delay is often used to secure a good current sample of the DC bus current after a particular switching sequence occurs to avoid switching transient signals. The minimum time delay adds to the difficulty of measuring the DC bus current, since there is not enough time between the differing switching states to obtain a current sample for at least one of the phases of the two that are measured, as illustrated in FIG. 2B. Accordingly, accurate motor phase current reconstruction cannot be properly achieved.

When the modulation index is low, resulting in short active voltage vectors that prevent proper sampling of the DC link current, one solution is to replace all active vectors less than a certain time period, 30 microseconds for example, with a zero vector, and then adding the missing time in the next switching period. This technique, however, results in poor performance at low speed due to high harmonic distortion.

Another technique reduces or eliminates zero vectors when the active vectors are too short, and introduces two complementary voltage vectors closest to those already used in the switching cycle. This technique introduces additional switching, and therefore generates more EMI noise. In addition, a very low modulation index still creates problems in performance.

Another technique for overcoming the above drawbacks is to adjust the duty cycle so that switching states are offset to permit an elimination of voltage error within a single switching period. Another technique uses two switching periods in the PWM control to adjust the duty cycles and remove voltage error between the switching events. While these techniques permit the PWM drive to operate at low speed, a higher sample rate is needed to avoid phase errors between the samplings of the motor current.

In a PWM inverter drive system, switching sequences cause current values delivered to the motor phases to ramp up or down over a given switching interval. In practice, it is not feasible to obtain a complete measurement of the current delivered in the motor drive system, due to the high speed processing that would be required. Accordingly, current values are sampled over a given switching interval, potentially resulting in large variations between estimated current values based on samples, and actual current values experienced by the motor. If a current sample taken during a ramp interval is used to estimate the changing current for the entire interval, inaccuracies will occur. It would be desirable to obtain a more accurate technique for sampling motor current based on switching sequences.

Another issue that arises in motor current sampling is transients or "ringing" in the DC bus current when switch transitions occur. An example of problems with ringing is illustrated in FIG. 3. If a sample of DC bus current is taken near a switching event where ringing occurs in a phase current, the sample may not accurately reflect motor phase current. In addition, the DC bus current is typically observed in the shape of a ramp when a switch transition occurs to energize a given phase. If a current sample is taken in an arbitrary part of the switching sequence where the motor phase current is ramping up, the sample DC bus current will not accurately reflect the average motor phase current value over the entire switching interval.

SUMMARY OF THE INVENTION

In accordance with the present invention, there is provided a system and method for operating a space vector PWM motor drive such that the measurement of DC bus current provides a more accurate indication of motor phase current. The reconstruction of motor phase currents from measurement of the DC bus current implements a technique that reduces non-observable regions during certain switching sequences in a 3-phase modulation system by switching to 2-phase modulation. The 2-phase modulation reduces the regions where current measurements of the DC bus do not provide accurate motor phase current determination, while reducing the switching events in a PWM cycle to further reduce EMI or noise generated by the motor drive system. During high speed operation, the motor drive system can be operated in 2-phase modulation mode without any significant adverse impact.

The intervals when motor phase current is not observable by sampling the DC bus current are reduced to a smaller domain (in particular, by half) with the use of 2-phase modulation. For example, 2-phase space vector modulation with alternating zero vectors (000,111) permits the minimum time for an unobservable effect of a basic vector to be decreased. In practical application, the time constraint related to non-observability is cut in half. By reducing this minimum time, the current distortion due to minimum pulse constraint can be reduced. When the voltage vector angle is larger than 30°, the zero vector 111 is used instead of 000. By using the different zero vector, a switched phase pulse time is maximized.

When motor current exceeds a certain threshold level, dead time need not be inserted and the time constraint can be further reduced. In certain motor drive system types, the motor can be started and operated in a 2-phase modulation mode. Other systems, such as those with level-shifting switch drivers, start in 3-phase modulation, and can switch to 2-phase modulation to run or start with 2-phase PWM with only zero vector (000) and then switch to (000+111).

When the command voltage falls inside the non-observable domains, the command voltage vector is formed from two additive substitute vectors, each generated in two different PWM periods. According to one embodiment, one generated additive vector has a phase equal to 30°, 90°, 150°, 210°, 270° or 330°, with a magnitude equal to two times the width of the non-observable section. Use of this vector ensures the observability of two of the three motor phase currents. The second vector is added in a later PWM cycle to compensate the first substitute voltage vector to arrive at the reference voltage vector inside the non-observable domain. The time average sum of the two additive vectors is equivalent to the time average of the reference voltage vector.

According to another embodiment of the present invention, reference voltage vectors that produce motor phase currents that are unobservable at the DC bus are compensated with applied voltage vectors at phases of 30°, 90°, 150°, 210°, 270° and 330°, depending upon the phase of the reference voltage vector, with a magnitude that is just sufficient to permit the motor phase current to be observable at the DC bus. This embodiment is particularly applicable to operation at a low modulation index, where the reference voltage vector has a small magnitude, such that it is constantly within the non-observable area of the space vector diagram. In this instance, the applied voltage vector is provided in a first PWM period, while the compensating, or error vector, is summed in with the reference voltage in the next PWM period, so that the time average of the applied and error voltage vectors is equivalent to the reference voltage vector.

According to another embodiment of the present invention, the voltage vector applied to obtain an observable motor phase current at the DC bus has a magnitude and phase that falls outside of the non-observable region, and the magnitude and phase are closely related to the reference voltage vector. An error voltage vector generated to compensate the applied voltage vector is thus very small, and can be readily applied in a subsequent PWM cycle. The compensating vector can be made small to reduce the resulting torque ripple and acoustic noise that may be encountered due to the time averaging of the vector sum to reproduce the equivalent reference voltage vector.

In accordance with another aspect of the present invention, the DC bus current is sampled to obtain an average current sample over a switching interval. For example, when a motor phase is energized through PWM switching sequences, a sample at the DC bus is taken at the beginning of the PWM pulse, and then again at the end of the PWM pulse, and the samples are averaged so that a value indicative of the center of the PWM pulse is obtained. In case of 3-phase modulation, four samples per PWM period may be taken and two respective samples are averaged to provide the current in two of the phases of the motor, with the third phase current being determinable from the current measures in the other two phases. In the case of 2-phase modulation, three samples may be taken of the DC bus current, with two of the samples being averaged to indicate the current in one of the phases, and the third sample being taken in the center of a PWM pulse to determine current in another of the motor phases, with a third phase current being determinable from the current measures in the first two phases. By using the current averaging technique, a more accurate representation of motor phase current can be determined based on reconstruction from samples of the DC bus current.

In accordance with another aspect of the present invention, current samples taken on the DC bus can be delayed a certain amount of time that is pre-selected to avoid ringing or transients in the motor phase currents that might otherwise provide erroneous results. The time delay can be specifically set so that the motor drive system can calculate the point in the PWM pulse where the sample is taken, so that an estimate of the average motor current can be obtained. That is, if the current sample is not taken in the center of the PWM pulse, the offset provided by the time delay can be used to determine the relative point in the PWM period where the current is sampled, so that an estimate of average current can be calculated. This sampling technique is particularly useful in low inductance motors where di/dt transients are more likely to cause current measurement errors.

BRIEF DESCRIPTION OF THE DRAWINGS

The present invention is described in detail below, with reference to the accompanying drawings having appropriate reference numeral designators, in which.

DETAILED DESCRIPTION OF THE PREFERRED EMBODIMENTS

Figure 4:
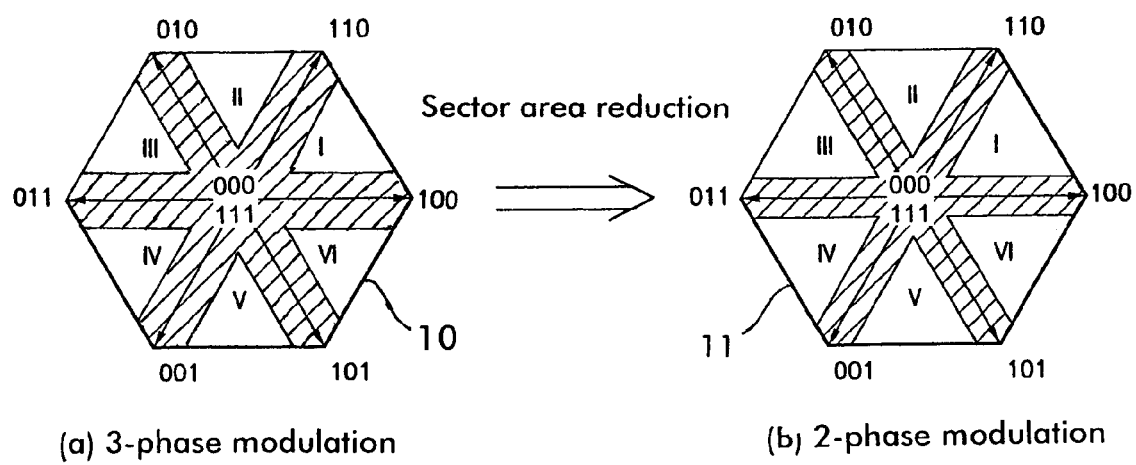
FIG. 4 is a vector diagram illustrating the reduction of non-observable zones in accordance with the present invention achieved by changing from three phase modulation to two phase modulation.
Figure 5:
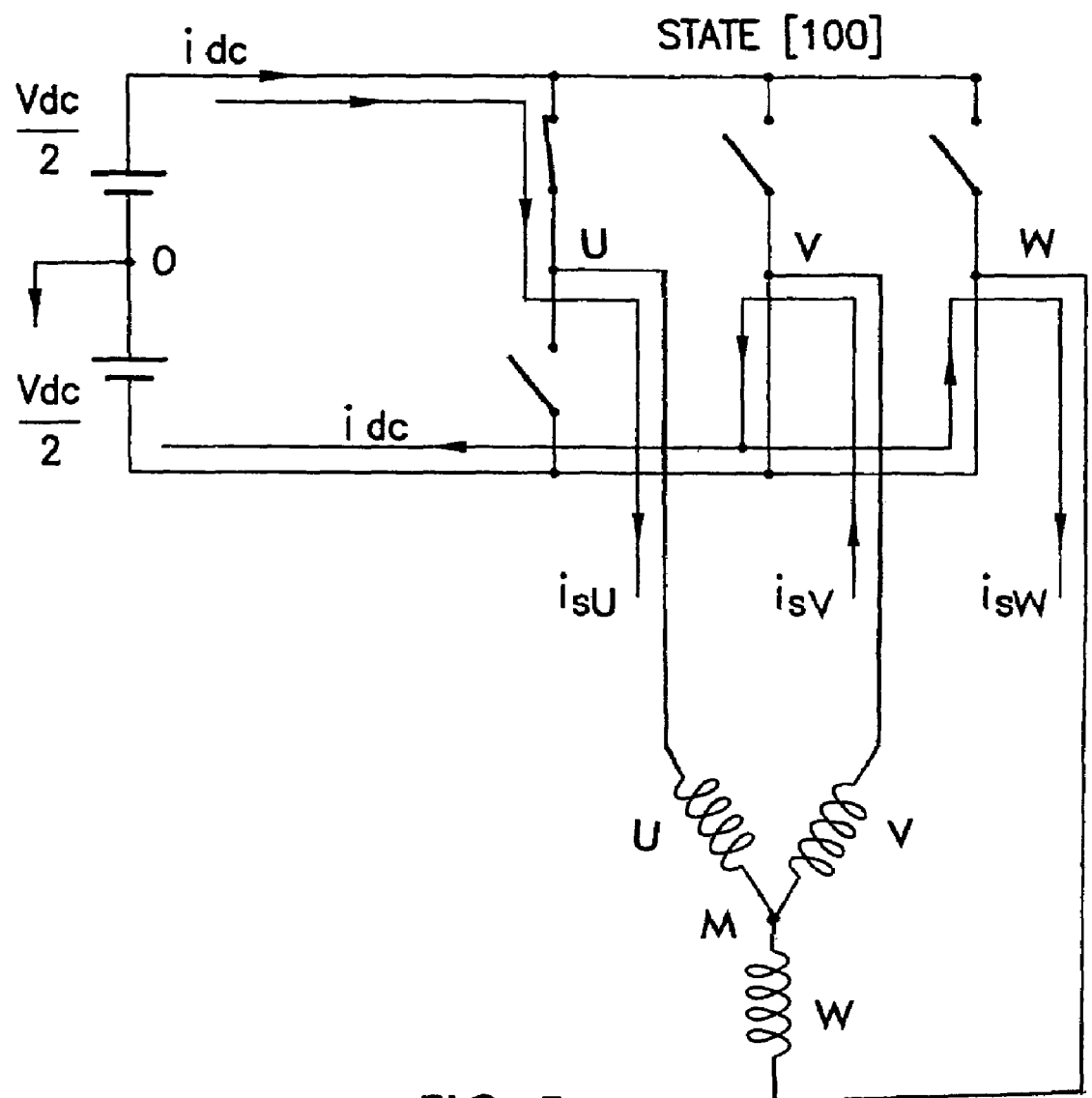
FIG. 5 is a simplified circuit diagram of an inverter for a motor drive system.

In a two level PWM inverter drive system, eight possible basic voltage vectors can be produced, including two zero basic voltage vectors 000 and 111. The non-zero basic voltage vectors are represented in the vector diagrams of FIGS. 1A, 2A and 4 and indicate states for a 2-level PWM inverter, such as that illustrated in FIG. 5. In the inverter of FIG. 5, the switches are shown in basic voltage vector state $V_1$, or 100.

Figure 1A:
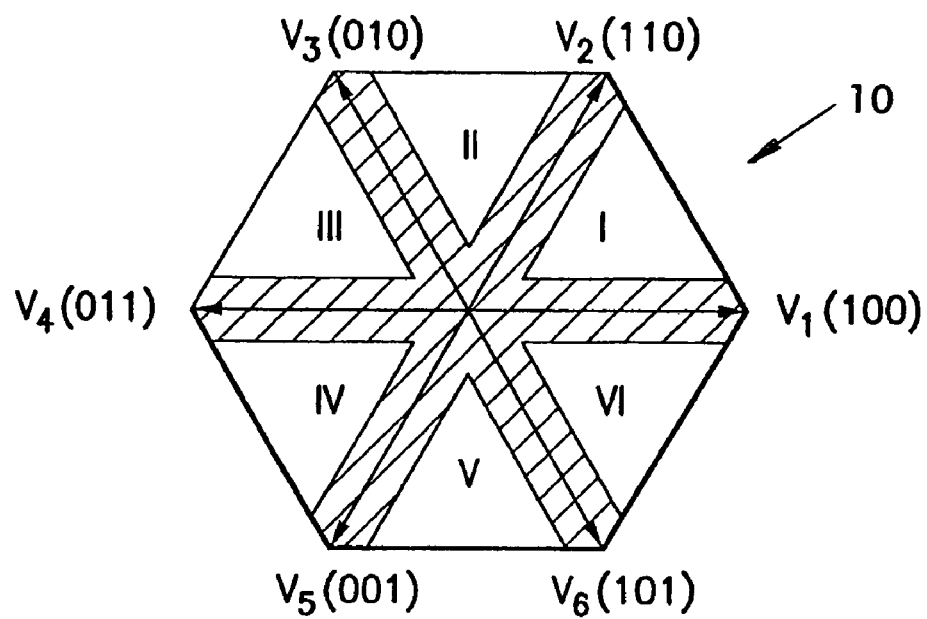
FIG. 1A is a voltage space vector plane diagram illustrating conventional non-observable zones due to system constraints.
Figure 1B:
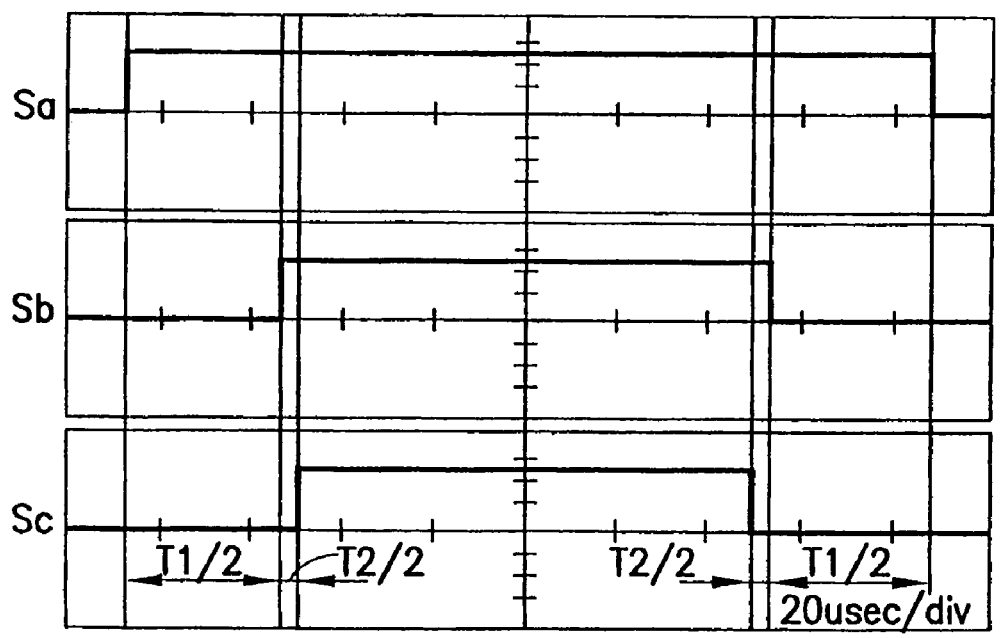
FIG. 1B is a timing diagram illustrating a switching sequence demonstrative of the non-observable zone of FIG. 1A.

Any desired command voltage vector can be formed by the eight basic voltage vectors. The desired command voltage vector is limited by the maximum output voltage of the inverter, as determined by the DC bus voltage level. In a PWM inverter drive system, motor phase current information can be determined from the DC bus current when non-zero basic vectors are used, such as in the case illustrated in FIG. 5. Each basic vector is assigned a specific time in a PWM cycle to generate a command voltage vector. If the command voltage vector is used only for a very short period of time as illustrated in FIG. 1B, the motor current cannot be observed from the DC bus current. This time constraint results from time delays associated with A/D conversion, including sample and hold times, in addition to voltage slewing resulting from device turn on and other parasitic effects that distort the DC link current from an ideal step waveform to an overshoot with ringing type waveform. It is this time constraint that forms the non-observable (shaded) regions in the voltage space vector plane illustrated in FIG. 1A.

The present invention provides an algorithm to reconstruct 3-phase motor current information from measurement of a DC bus current supply. A voltage space vector plane 10, as illustrated in FIG. 1A, contains non-observable regions near sector borders, shown shaded. According to a feature of the present invention, a voltage space vector plane 11 (see FIG. 4b) is produced with reduced non-observable zones when the space vector modulation arrangement is changed from 3-phase to 2-phase modulation during a given PWM cycle (FIG. 4).

Figure 6A:
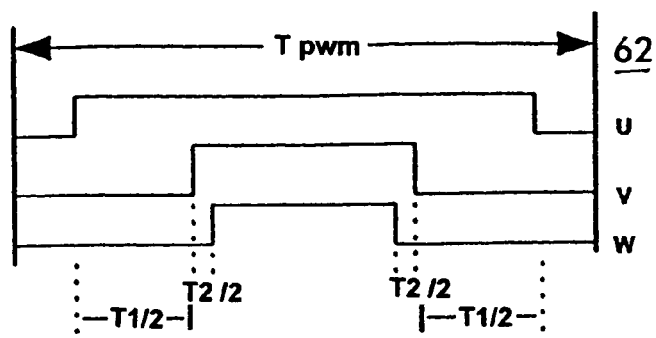
FIG. 6A is a diagram of a PWM cycle using three phase modulation with an associated reference vector.
Figure 6A:
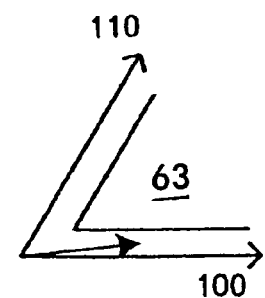

Referring to FIG. 6A, a conventional 3-phase inverter provides a 3-phase voltage space vector PWM modulation, illustrated in a timing diagram 62 where all three phases are switched in one PWM cycle. A corresponding space vector or commutation diagram 63 shows the reference voltage vector in a non-observable region near the 100 basic vector. The non-observable reference voltage vector results from the narrow intervals between energization of phases V and W, or when the 3-phase modulation control switches from the 110 basic vector to the 111 zero basic vector or vice versa. The narrow intervals between switching events each have a width of T2/2, which is too small to permit DC bus current measurements from accurately indicating one of the two-phase current measures needed for complete motor phase current reconstruction. Time T2 is the sum of the differences between the on time and off time of the phases V and W. Diagram 62 also shows that, over the course of the PWM cycle defined by the interval Tpwm, six switching events are observed, so that each of the sets of switches illustrated in FIG. 5 change state.

Figure 6B:
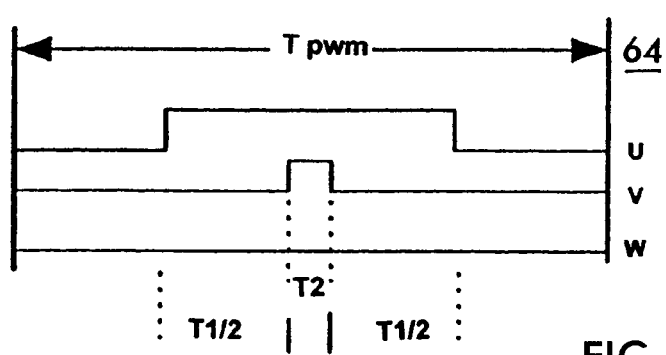
FIG. 6B is a diagram of a PWM cycle using two phase modulation with an associated reference vector in accordance with the present invention.
Figure 6B:
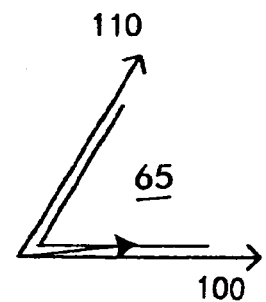

Referring now to FIG. 6B, a reference voltage vector equivalent to that shown in vector diagram 63 can be formed using 2-phase voltage space vector PWM, as illustrated in commutation diagram 65. With 2-phase voltage space vector modulation, a minimum time constraint for non-observability is cut in half as shown in diagram 65. In addition, four switching events are observed, rather than six, in the 2-phase versus 3-phase modulation, illustrated in timing diagram 64. The total interval time T2 (on time for the high side switch connected to phase V) is localized in one spot, thereby providing a greater opportunity to observe motor phase current through DC bus current measurement. Indeed, the available time for measurement of DC bus current to determine motor phase current is doubled.

Figure 6C:
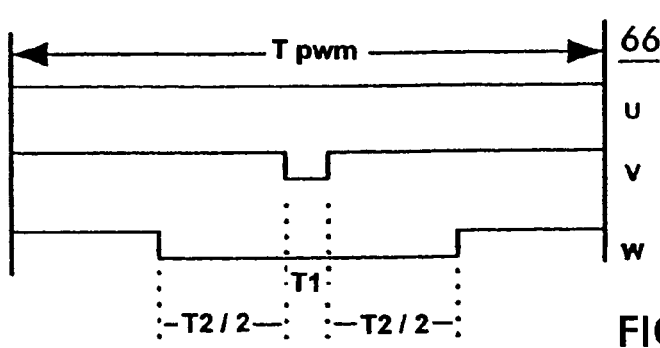
FIG. 6C is a diagram of a PWM cycle using two phase modulation with an associated reference vector in accordance with the present invention.
Figure 6C:
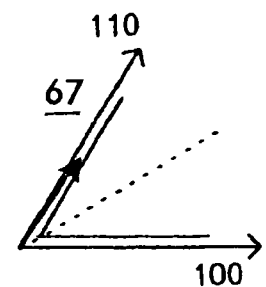

Referring now to FIG. 6C, a switching sequence where the reference voltage vector is greater than 30° is illustrated. In this instance, the zero basic vector 111 is chosen to obtain an interval that is as long as possible for time period T1 (vector 100). A timing diagram 66 illustrates the use of the zero basic vector 111 in the PWM cycle rather than the zero basic vector 000 to maximize T1 time. Commutation diagram 67 illustrates the relevant reference voltage vector being greater than 30° according to this arrangement.

Figure 11:
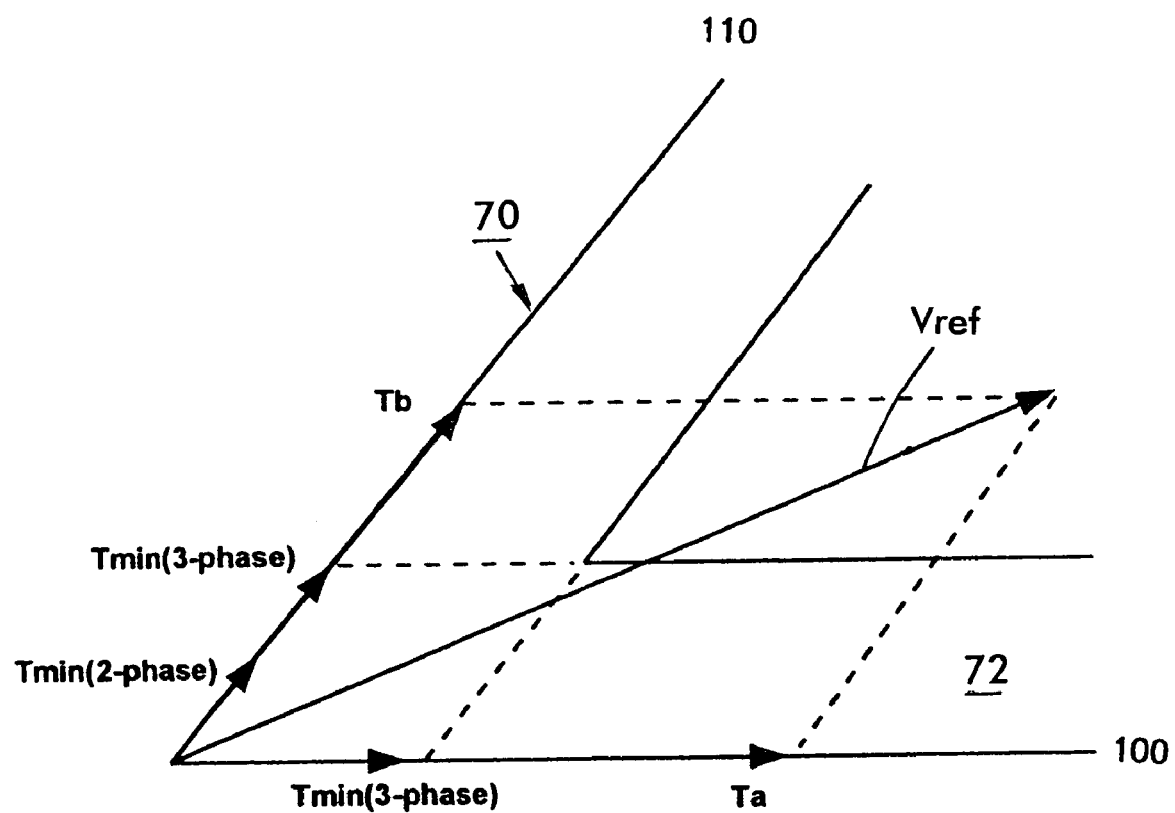
FIG. 11 is a vector diagram illustrating criteria for selecting 3-phase or 2-phase modulation.

Referring momentarily to FIG. 11, criteria for the selection between 3-phase and 2-phase modulation for a single shunt current measurement is described relative to vector diagram 70. The PWM modulator has the capability to switch back and forth between 3-phase and 2-phase modulation dynamically. A reference voltage vector Vref is illustrated in diagram 70 as being located in an observable region between basic voltage vectors 100 and 110. Vector Vref is composed of component vectors Ta and Tb that lie along basic voltage vector axes 100 and 110. A non-observable region 72 is illustrated for 3-phase modulation to obtain minimum time constraints for choosing between 3-phase and 2-phase modulation. Minimum observable component vectors Tmin are shown along basic voltage vector axes 100 and 110 to illustrate the time constraints for selection between 3-phase and 2-phase modulation. If both component vectors Ta and Tb are greater in magnitude than minimum voltage vector Tmin, then 3-phase modulation can be used and an observable motor phase current can be obtained for at least two phases in a PWM switching cycle by measuring DC bus current. If either of component vectors Ta or Tb are less than Tmin, resulting voltage reference vector Vref falls within non-observable area 72, preventing accurate motor phase current reconstruction by measuring DC bus current. Thus, if ((Ta and Tb)>Tmin( 3-phase)), 3-phase modulation is used. Otherwise 2-phase modulation is used Under these conditions, 2-phase modulation is selected to reduce non-observable area 72, resulting in a non-observable region that is half that of the 3-phase modulation non-observable region. An illustrative voltage vector Tmin for 2-phase modulation is shown on basic voltage vector axis 110 to indicate the dimension of the reduced non-observable region. The transition from 3-phase modulation observability to 2-phase modulation observability is illustrated in FIG. 4 for each of the different commutation diagram sectors.

A further reduction in the non-observable time constraint can be achieved. When motor current is higher than a given threshold, the need to insert dead time is eliminated. Typically, the time constraint can be written as a minimum time Tmin as follows:

$$T\min = Td + T(dv/dt) + T(A/D)$$

$$\text{where} \begin{cases} Td = \begin{bmatrix} T deadtime & \text{abs}(i) < \text{Threshold} \\ 0 & \text{abs}(i) > \text{Threshold} \end{bmatrix} \\ T(A/D) \ A/D \text{ converter sample/hold time} \\ T(dv/dt) \text{ Power switching device slew time} \end{cases}$$

Accordingly, when Td is equal to zero, Tmin is reduced accordingly.

Figure 7:
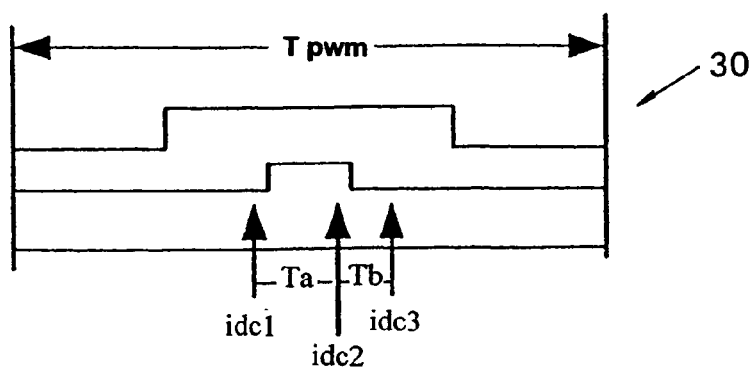
FIG. 7 is a diagram of a PWM cycle illustrating DC bus current sampling and calculation.

Referring now to FIG. 7, the DC bus current is sampled three times every PWM cycle using 2-phase modulation. In FIG. 7, samples idc1 and idc3 are used to determine the motor phase current for the same motor phase, but at different time instants. Sample Idc2 determines the current in phase W, as shown in FIG. 7 or by reviewing FIG. 5. Current samples idc1 and idc3 are combined based on the equations shown in FIG. 7 to provide an average current value for phase U.

Current sample idc2 is taken during the interval of active vector 110. In this example, phases U and V are energized during sample idc2, so that the result of the sample is the sum of currents in phases U and V, i.e., the current in phase W. The current iw is equal to-idc2. Since the motor phase current varies over the interval between samples idc 1 and idc3, it is desirable to obtain an estimate of the current values based on the interval size and the value of the current samples. Based on the time intervals between samples, an estimate of the phase current can be calculated. That is, the current samples idc1 and idc3 are time averaged together based on the interval spacing. Accordingly, iu=Tb/$T_t$ x idc1+Ta/$T_t$ x idc3, where $T_t$=Ta+Tb.

Figure 8A:
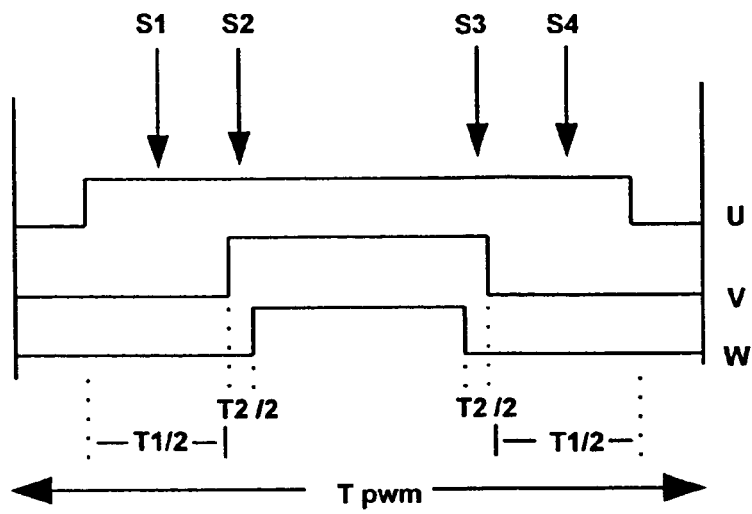
FIG. 8A is an illustration of a three-phase PWM cycle with four current sample averaging.

In accordance with another embodiment of the present invention, sampling intervals may be taken over the course of a PWM cycle in either a 3-phase or a 2-phase modulation. For example, referring to FIG. 8A, four samples S1–S4 are taken over the course of a single PWM cycle under 3-phase modulation control. In the example illustrated in FIG. 8A, it would be desirable to obtain a current sample at the center of the PWM cycle for a given phase, so that a single sample could be used to represent the current as it changes over the interval of the phase energization. However, because a single current sensor on the DC bus is used to obtain the current samples, the current flowing through the DC bus will not be differentiated to determine the current in each of the two different phases. Accordingly, for a 3-phase modulation, two sets of two samples of the DC bus current can be taken in a PWM cycle and then each set is averaged together to obtain an estimate of the current value that would result from taking a sample in the center of the PWM pulse. As illustrated in FIG. 8A, sample 51 is taken near the beginning of the PWM cycle which will determine the current in phase U, and sample 54 is taken near the end of the PWM cycle also determining the current in phase U. Samples S1 and S4 are then averaged together [(S1+S4)/2] to obtain a value that represents a sample taken at the center of the PWM cycle for phase U. Similarly, samples S2 and S3 are taken as shown, determining the current in phase W. An average of samples S2 and S3 [S2+S3)/2] provides a good estimate of the phase current in phase W provided during the PWM interval.

Figure 8B:
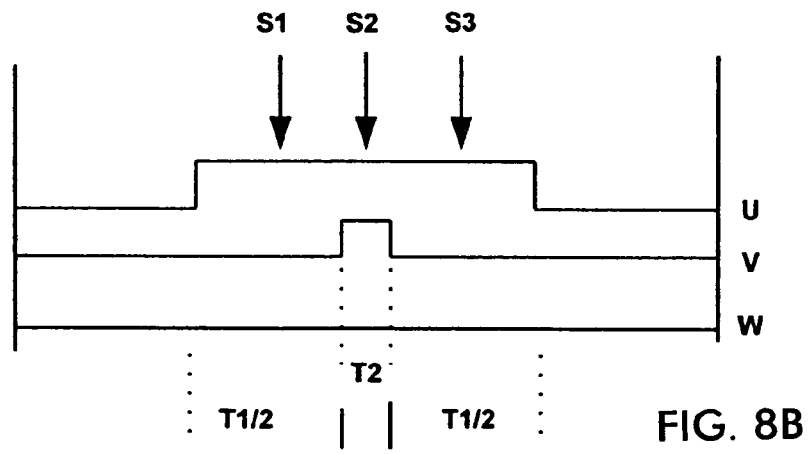
FIGS. 8B and 8C are illustrations of two-phase PWM cycles with three current sample averaging.
Figure 8C:
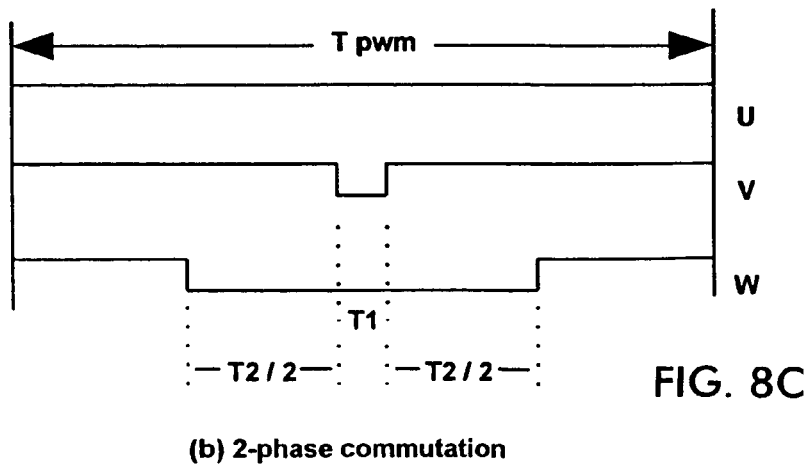

With respect to FIG. 8B, samples S1–S3 are taken during 2-phase modulation with a zero basic vector of 000. Samples S1 and S3 determine phase U current and are averaged together to obtain an equivalent current sample taken in the center of the PWM cycle for phase U. A sample S2 is taken in the center of the PWM pulse for phase W, determining the phase W current. These samples are all that are needed to obtain good estimates of current values for two phases, where the current in the third phase may be readily determined from the other two phase currents. Accordingly, the use of 2-phase modulation permits the taking of three samples in a PWM period to reconstruct motor current in the three different phases. In FIG. 8 C, samples S1–S3 are taken during 2-phase modulation with a zero basic vector of 111. Samples S1 and S3 are obtained and averaged [(S1+S3)/2] for current in phase W, while sample S2 indicates current in phase U, as illustrated in FIG. 8C.

Figure 9:
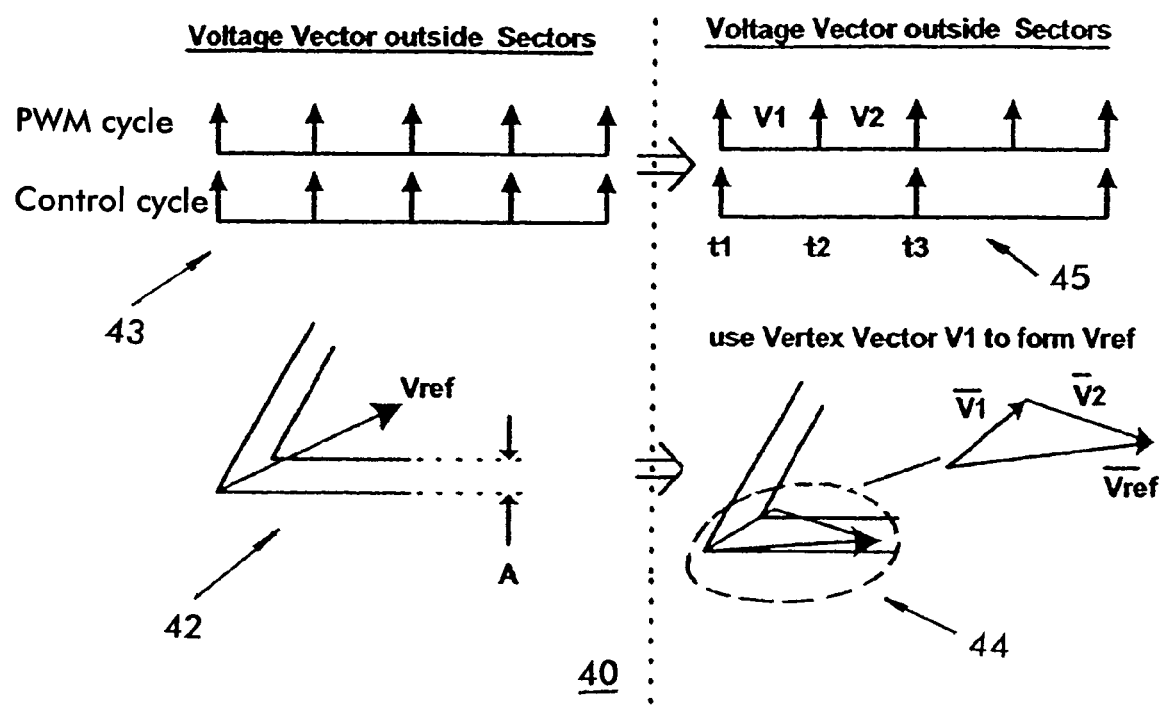
FIG. 9 is an illustration of non-observable reference vector compensation in accordance with one embodiment of the present invention.

Referring now to FIG. 9, a typical reference voltage vector Vref is illustrated in diagram 40. In space vector diagram 42, reference voltage vector Vref resides in an observable area of operation of the PWM inverter. Accordingly, current measurements taken on the DC bus reflect the motor phase currents brought about by applying vector Vref to the space vector modulation control. In the instance of vector diagram 42, a minimum non-observable region is described as having a width A, resulting from the minimum amount of time needed to obtain a current sample on the DC bus. As shown in FIG. 9, region A has a width related to Tmin, as desribed above.

$$A = \frac{T_{\min}}{T_{PWM}} \cdot \frac{\Pi}{\sqrt{3}}$$

Referring to vector diagram 44, reference voltage vector Vref falls within a non-observable region of the vector diagram, meaning that the switching sequences brought about by applying reference voltage vector Vref are too short in time to permit the motor phase currents from being observed by measuring the DC bus current. In accordance with the present invention, reference voltage vector Vref is provided as the time average of two substitute additive voltage vectors, V1 and V2. When reference voltage vector Vref is inside the non-observable sector bands, the time-average equivalent is formed by vectors V1 and V2 generated in two PWM cycles. Preferably, the PWM cycles are sequential. In the example shown, voltage vector V1 has a phase equal to 30° and a magnitude greater than the non-observable sector width A. By forming vector V1 according to these constraints, observation of two motor phase currents is ensured. Vector V2 is added to vector V1 to form the resulting reference voltage vector Vref. The time average of vector V1 plus vector V2 is equal to the time average of vector Vref, as illustrated in FIG. 9. In particular.

$$\int_{t_1}^{t_3} \overline{V}_{ref} = \int_{t_1}^{t_2} \overline{V}_1 + \int_{t_2}^{t_3} \overline{V}_2$$

Figure 10A:
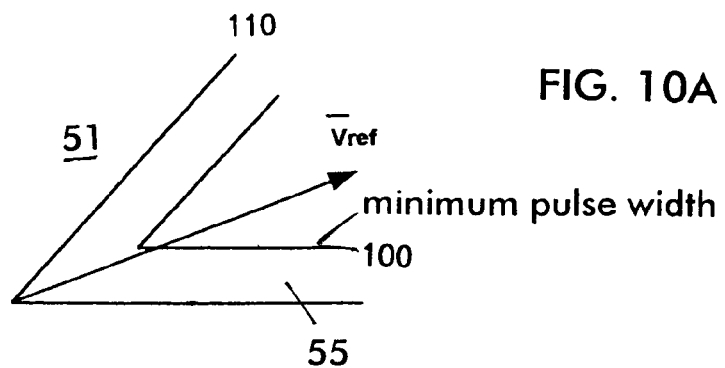
FIGS. 10A–10C illustrate various cases for reference voltage vector compensation in accordance with the present invention.
Figure 10B:
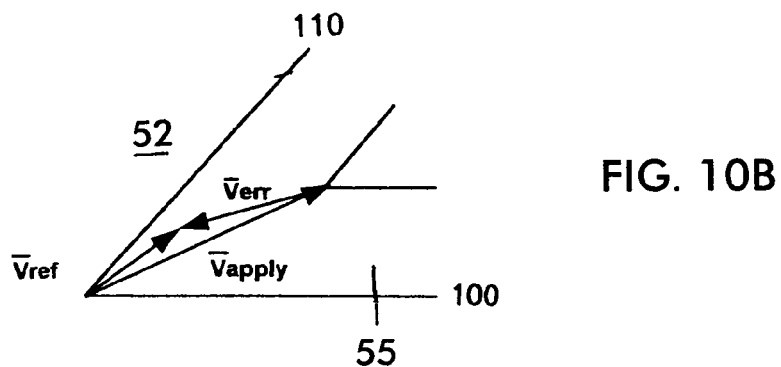
Figure 10C:
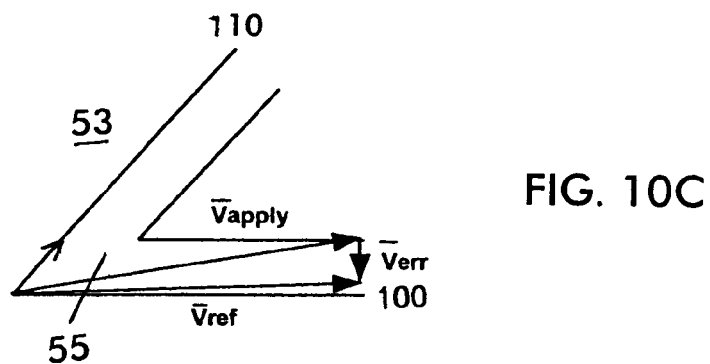
Figure 10D:
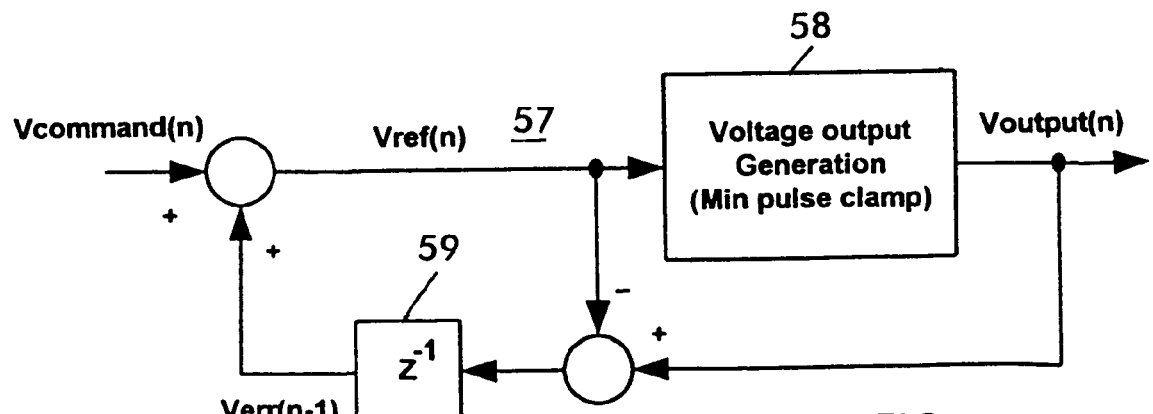
FIG. 10D is a block diagram illustrating the generation of vectors in the motor drive system.

Referring now to FIGS. 10–10C, vector diagrams 51–53 illustrate three different cases of the application of a reference voltage vector Vref during 3-phase modulation. Referring to FIG. 10D, a system block diagram 57 illustrates the generation of the vectors used in controlling the motor drive system. The following is a key to the signals:
Vcommand—modulation command from motor controller
Voutput—actual modulation output
Verr—modulation error
Vref—reference modulation request
where n is denoted as the present PWM cycle
n−1 is denoted as the previous PWM cycle A block 58 is used to generate an applied voltage vector Vapply that can be substituted for reference vector Vref in the output vector Voutput. An error vector Verr is generated from reference vector Vref and output vector Voutput with a time delay element 59, so that error vector Verr will be applied in the next PWM switching cycle.

In vector diagram 51, reference voltage vector Vref lies outside of a non-observable region 55.
Verr(n−1)=O
Vref(n)=Vcommand(n)+Verr(n−1)
Voutput(m)=Vref(n)

In this instance, there is no need to compensate voltage vector Vref to obtain switching sequences to provide an observable current measure at the DC bus, since the DC bus current may be sampled when voltage vector Vref is applied to accurately measure phase currents in the motor drive. Accordingly, output vector Voutput is set to reference vector Vref. The width of non-observable region 55 in vector diagram 51 approximates the width of a minimum pulse that can be applied in the PWM system.

In vector diagram 52, reference voltage vector Vref lies inside of non-observable region 55.
Vref(n)=Vcommand(n)+Verr(n−1)
Verr(n)=Vapply(n)−Vref(n)
Voutput(n)=Vapply(n)

Figure 2A:
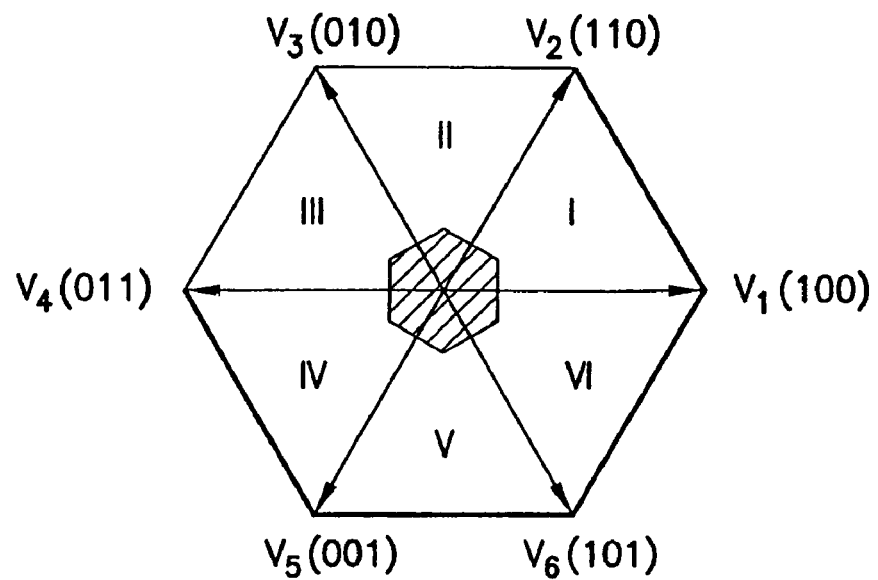
FIG. 2A is a vector diagram illustrating operation of a motor drive system with a low modulation index.
Figure 2B:
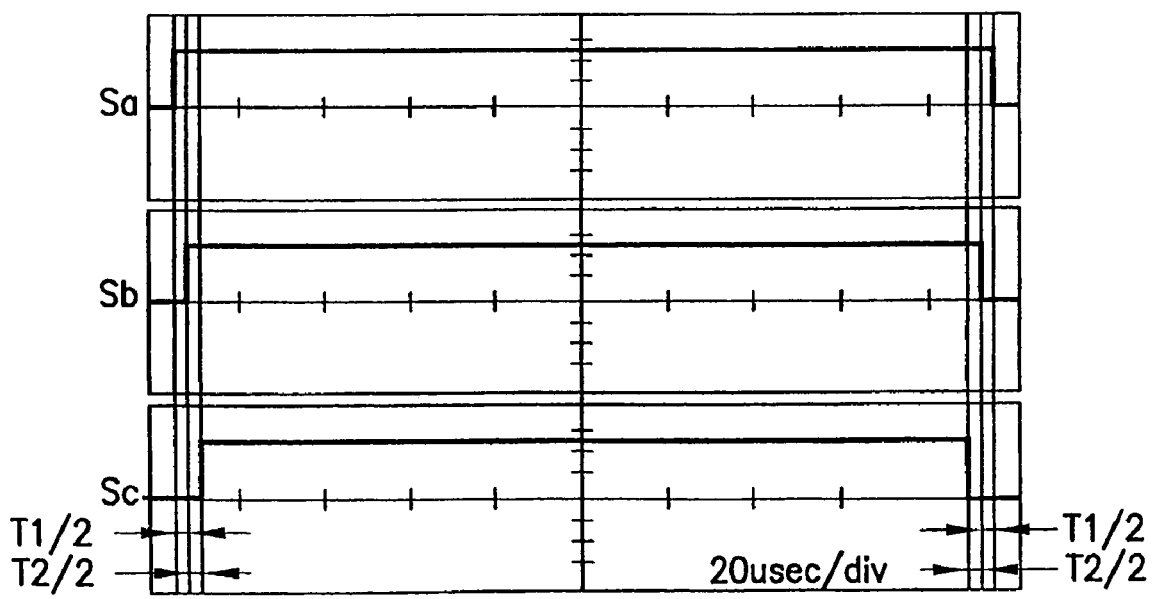
FIG. 2B is a timing diagram showing a switching sequence related to the vector diagram of FIG. 2A.

In this instance, the component basic vectors that make up reference voltage vector Vref each have a magnitude less than Tmin, as better illustrated in FIGS. 2A, 2B. Accordingly, reference voltage vector Vref is compensated to obtain a switching sequence for the motor phase currents that permits the currents to be observed by measurement of the DC bus current. In this instance, output vector Voutput is set to a calculated applied vector Vapply, rather than reference voltage vector Vref. The case illustrated in vector diagram 52 is similar to that described in FIG. 9, with the difference being that the applied voltage vector Vapply is set to be as small as possible, while still producing observable switching sequences. Accordingly, the magnitude of voltage vector Vapply falls just outside the non-observable region 55, at an angle of 30°. Therefore, the switching sequence produced by voltage vector Vapply provides phase currents that permit a current measurement taken on the DC bus to accurately indicate motor phase current. To compensate the space vector modulation shown in diagram 52, a compensating vector Verr is applied to the space vector modulation in the next PWM cycle. Voltage vector Verr has a phase and magnitude such that when added to voltage vector V apply, the result is reference voltage vector Vref. For example, as indicated in system block diagram 57, reference vector Vref (n) is equal to command voltage vector Vcommand (n) plus voltage error vector Vert (n−1). Error vector Verr (n) is equal to applied vector Vapply (n) minus reference voltage vector Vref (n). Preferably, voltage vectors Vapply and Verr are applied in sequential switching cycles to minimize any impact on performance that may result from applying a compound vector, rather than the original voltage vector Vref. In vector diagram 52, the small magnitude of reference voltage vector Vref indicates a low modulation index where the technique of the present invention is particularly useful. This technique also avoids the difficulties associated with changing frequency or shifting sequences within a single PWM period.

In vector diagram 53, a third case of a reference voltage vector Vref is considered.
Voutput(n)=Vapply(n)
Verr(n)=Vapply(n)−Vref(n)

In vector diagram 53, reference voltage vector Vref has a relatively large magnitude, but still resides in a non-observable region 55. Region 55 is unobservable because a number of switching transitions occur in relatively close proximity, so that two separate phase measurements may not be accurately obtained by measuring the DC bus current. In this instance, an observable voltage vector Vapply is substituted for reference voltage vector Vref and output as vector Voutput, where voltage vector Vapply has a similar angle and magnitude to those of reference voltage vector Vref. Error voltage vector Verr (n) is calculated as applied voltage vector Vapply (n) minus reference voltage vector Vref (n). In a particular embodiment, voltage vector Vapply is constructed so that it has the same component vector on the 100 basic vector axis as does reference voltage vector Vref. In this way, the compensating voltage vector Verr is minimized in magnitude. Stated another way, voltage vector Vapply is designed to reside in the observable area of vector diagram 53 at the point closest to reference voltage vector Vref. In the example of vector diagram 53, compensating voltage vector Verr is vertical, or perpendicular to basic vector axis 100.

When reference voltage vector Vref has a relatively large magnitude, as illustrated in vector diagram 53, the motor is operating at a relatively high speed. During high speed operation, it is possible to apply a space vector modulation control with 2-phase modulation in each PWM cycle to further reduce a non-observable region, while avoiding any significant impact to motor drive performance.

Figure 3:
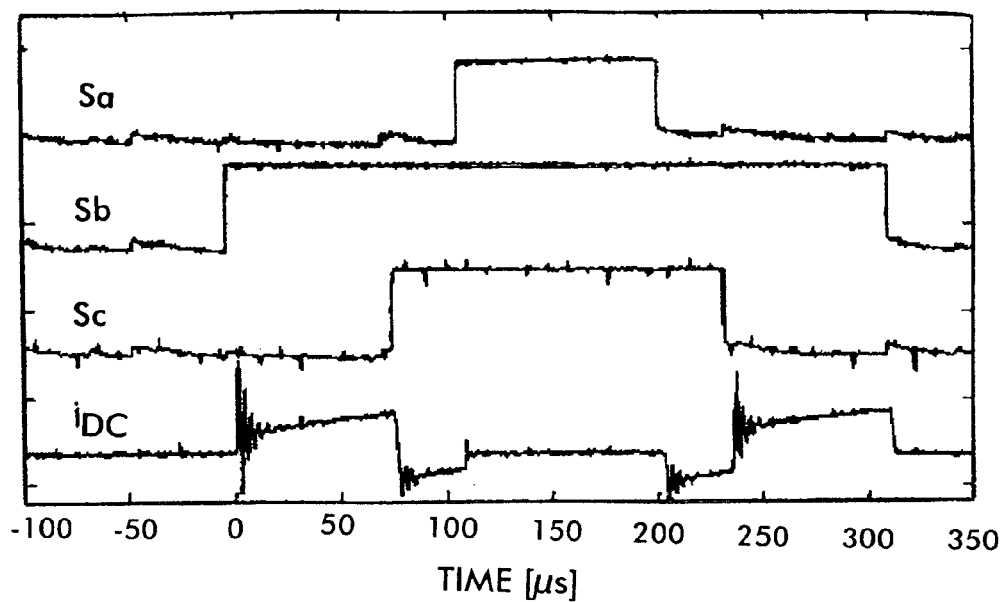
FIG. 3 is a timing diagram showing switching sequences and associated DC bus current.

Referring now to FIG. 3, another aspect of the present invention provides for sampling DC bus current to reconstruct motor phase current after a specified time delay to permit the sample to be taken after switching transients or "ringing" have subsided. This technique can potentially increase the dimensions of the non-observable regions in the space vector diagram, because of the additional delay provided to avoid inaccurate current measurements. However, such a delay can be compensated for by using the techniques described above.

In the case of high inductance motors, where di/dt is relatively low, a current measure taken near the end of a motor phase energizing event produces a current sample that forms a good approximation of the motor phase current over the entire energizing interval, because the current value during the interval changes at a more predictable rate than in lower inductance motors. Accordingly, a good approximation of motor phase current through measurements of the DC bus current near an end of a phase energization interval is possible, and has the potential to reduce the length of the energization interval. For example, if an energizing interval can be reduced according to a desired result using the space vector modulation model, a good current sample reflecting motor phase current can still be obtained from the DC bus if the current sample is taken near the end of the shortened energizing interval. This feature also permits reduced minimum pulse clamping because of the additional compensation available, leading to an improved 2-phase or 3-phase modulation arrangement.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A method for reconstructing motor phase current from a DC bus current on a DC bus in a PWM inverter motor drive system and for controlling the motor, comprising:
   forming a command voltage vector according to a space vector modulation arrangement for controlling the motor;
   measuring the DC bus current on the DC bus supplying power to the inverter to obtain an indication of motor current;
   determining when the command voltage vector results in an inverter switching state that prevents the measuring of the DC bus current from accurately indicating motor phase current;
   switching the PWM inverter motor drive system from three phase modulation to two phase modulation to reduce the minimum pulse clamping produced by the PWM inverter motor drive system thereby allowing dc bus current measurement with reduced acoustic noise and torque ripples;
   forming a voltage vector sum from two additive vectors, the vector sum being substantially the same as the command voltage vector, wherein at least one of the additive vectors represents a switching state permitting the measuring of the DC bus current to indicate motor phase current;
   applying at least one of the additive vectors to the space vector modulation in a first switching cycle of the PWM inverter drive system wherein a switchin cycle is defined by the PWM period of the PWM inverter motor drive system; and
   applying the other additive vector to the space vector modulation in a second switching cycle of the PWM inverter drive system, such that the time average of the additive vectors is equivalent to the command voltage vector thereby to compensate for a voltage error introduced by the at least one vector that permits the measuring of the DC bus current to indicate motor phase current.

2. A space vector PWM motor drive system operated in accordance with the method of claim 1.

3. A method for determining phase current in a motor by measuring DC bus current supplied to an inverter in a state vector motor drive system having a PWM period and for controlling the motor, comprising:
   determining when a command voltage is located in a non-observable sector of a voltage space vector plane defining the switching states of the inverter such that accurate measurement of the phase current by measuring the DC bus current can not be obtained;
   switching the PWM inverter motor drive system from three phase modulation to two phase modulation to reduce the minimum pulse clamping produced by the PWM inverter motor drive system thereby allowing dc bus current measurement with reduced acoustic noise and torque ripples;
   applying a first voltage vector to the state vector motor drive system in a first cycle of the PWM inverter drive system, wherein a switching cycle is defined by the PWM period of the PWM inverter motor drive system, the first voltage vector having an angle and a magnitude such that the first voltage vector is outside the non-observable sector;
   applying a second voltage vector to the state vector motor drive system in a second switching cycle of the PWM inverter drive system, the second voltage vector having a phase and magnitude such that the command voltage vector results from a time average sum of the first and second voltage vectors
   thereby to compensate for a voltage error introduced by the first voltage vector.

4. The method according to claim 3, wherein the first voltage vector has a phase of 30° +/−Nx 60°, where N+0,1, . . . , 5.

5. A space vector PWM motor drive system operated in accordance with the method of claim 3.

6. A method for obtaining a measure of phase output current from a power inverter from measurement of DC bus current supplying the inverter, the inverter having a PWM period defining a switching cycle, the method comprising:
   determining when the formation of a command voltage vector to the inverter causes phase current from the power inverter to be unobservable by a DC bus current measurement;
   switching the PWM inverter motor drive system from three phase modulation to two phase modulation to reduce the minimum pulse clamping produced by the PWM inverter motor drive system thereby allowing dc bus current measurement with reduced acoustic noise and torque ripples;
   applying a first voltage vector to the power inverter in a first PWM switching cycle to permit phase current to be observable by the DC bus current measurement; and
   applying a second voltage vector to the inverter in a second PWM switching cycle for combination with the first voltage vector in a time average sum, such that the result is approximately the same as the time average of the command voltage vector thereby to compensate for a voltage error introduced by at least one of the voltage vectors.

7. A space vector PWM motor drive system operated in accordance with the method of claim 6.

8. A method for reconstructing motor phase current in an inverter drive system for a motor, comprising:

measuring currents applied on a DC bus supplying power to the inverter to obtain an indication of electrical phase current in the motor;

determining when a three phase PWM inverter modulation results in motor switching that results in inability to determine the motor phase current through the DC bus current measurement; and dynamically changing from three phase pulse width modulation to two phase pulse width modulation for a switching cycle of the inverter drive system to reduce the time interval when the motor phase current is not determinable through the DC bus current measurement, wherein the step of changing from three phase pulse width modulation to two phase pulse width modulation comprises changing from three phase pulse width modulation to two phase pulse width modulation for any switching cycle that is determined to include a switching event where the motor phase current is not determinable through measurement of the DC bus current.

9. The method according to claim 8, further comprising changing from three phase modulation to two phase modulation when the motor is running at a high speed.

10. The method according to claim 8, further comprising eliminating a deadtime insertion when motor current is higher than a given threshold, thereby reducing the time interval during which motor phase current is not determinable through measurement of DC bus current.

11. The method according to claim 8, further comprising selecting an alternate zero vector (000, 111) in order to maximize the time for current measurement.

12. The method according to claim 11, wherein zero vector 111 is used as the alternate zero vector.

13. A space vector PWM motor drive system operated in accordance with the method of claim 8.

* * * * *